(12) United States Patent
Tu et al.

(10) Patent No.: US 12,476,603 B2
(45) Date of Patent: Nov. 18, 2025

(54) BALUN FILTER

(71) Applicant: QuantumZ Inc., Kaohsiung (TW)

(72) Inventors: Kun Yen Tu, Kaohsiung (TW); Meng-Hua Tsai, Kaohsiung (TW); Wei Ting Lee, Kaohsiung (TW); Sin-Siang Wang, Kaohsiung (TW)

(73) Assignee: QuantumZ Inc., Kaohsiung (TW)

(*) Notice: Subject to any disclaimer, the term of this patent is extended or adjusted under 35 U.S.C. 154(b) by 221 days.

(21) Appl. No.: 18/391,686

(22) Filed: Dec. 21, 2023

(65) Prior Publication Data

US 2024/0223150 A1 Jul. 4, 2024

(30) Foreign Application Priority Data

Dec. 29, 2022 (TW) .................................. 111150706

(51) Int. Cl.
*H03H 7/42* (2006.01)
*H01P 3/08* (2006.01)
*H03H 7/01* (2006.01)
*H05K 1/02* (2006.01)

(52) U.S. Cl.
CPC ................ *H03H 7/01* (2013.01); *H01P 3/08* (2013.01); *H03H 7/42* (2013.01); *H05K 1/0243* (2013.01); *H05K 2201/1006* (2013.01)

(58) Field of Classification Search
CPC ... H03H 7/01; H03H 7/42; H01P 3/08; H05K 1/0243; H05K 2201/1006
See application file for complete search history.

(56) References Cited

U.S. PATENT DOCUMENTS

| | | | |
|---|---|---|---|
| 6,278,340 B1* | 8/2001 | Liu | H01P 5/10 333/33 |
| 2002/0171529 A1* | 11/2002 | Tang | H03H 7/38 336/200 |
| 2010/0148885 A1* | 6/2010 | Tzuang | H01P 3/08 333/116 |
| 2013/0093531 A1* | 4/2013 | Ujita | H01P 5/10 333/26 |
| 2014/0240056 A1* | 8/2014 | Isom | H01P 5/10 333/26 |
| 2022/0190803 A1* | 6/2022 | Azizi | H03H 7/42 |

* cited by examiner

*Primary Examiner* — Samuel S Outten
(74) *Attorney, Agent, or Firm* — CKC & Partners Co., LLC

(57) ABSTRACT

A Balun filter is disposed on a circuit board, and includes a first wire, a second wire, a third wire and a ground plane. The first wire has one end for disposing a first feeding point. The second wire has one end for disposing a second feeding point. The third wire is configured for disposing a third feeding point and includes a first coupling section, a second coupling section, a first central section and a second central section. The third feeding point is located between the first central section and the second central section, and the first coupling section, the first central section, the second central section and the second coupling section are electrically connected in sequence. In a parallel direction of the first wire, the first feeding point and the second feeding point are located in two opposite directions, respectively, relative to the third feeding point.

10 Claims, 7 Drawing Sheets

BALUN FILTER

RELATED APPLICATIONS

This application claims priority to Taiwan Application Serial Number 111150706, filed Dec. 29, 2022, which is herein incorporated by reference.

BACKGROUND

Technical Field

The present disclosure relates to a Balun filter. More particularly, the present disclosure relates to a Balun filter disposed on a circuit board.

Description of Related Art

Various wireless communication systems have been developed pursuing ever more convenience. However, such development of wireless communication systems also increases sizes, costs and design complexities of RF (Radio Frequency) front-end modules.

A Balun (Balanced-to-Unbalanced) is a balanced-to-unbalanced component in the RF front-end module. The Balun is coupled to an antenna and converting the balanced and unbalanced signals. It is needed to be coupled to or integrated with a filter before inputting signals into the RF chip (i.e., RF integrated circuit) for signal processing. However, large surface or volume of the RF front-end modules is needed when Balun and filter designed separately. Furthermore, the RF front-end module usually includes multiple chip capacitors and chip inductors to form the Balun, filter and matching circuit that will increase the module volume, manufacturing cost and time, and the manufacture yield rate will also relatively reduce.

Given the above, reducing the module volume, manufacturing cost and time of the RF front-end module with Balun and filter required by the wireless communication system has become a subject.

SUMMARY

According to one aspect of the present disclosure, a Balun filter is disposed on a circuit board, and includes a first wire, a second wire, a third wire and a ground plane. The first wire has one end for disposing a first feeding point. The second wire has one end for disposing a second feeding point. The third wire is configured for disposing a third feeding point and includes a first coupling section, a second coupling section, a first central section and a second central section. The first coupling section is parallel and coupled to the first wire, and the second coupling section is parallel and coupled to the second wire. The third feeding point is located between the first central section and the second central section, and the first coupling section, the first central section, the second central section and the second coupling section are electrically connected in sequence. The first wire, the second wire and the third wire are all located on a conductive layer of the circuit board, the ground plane is located on another conductive layer of the circuit board, and each of the first wire, the second wire and the third wire is coupled to the ground plane and forms a transmission line with the ground plane. In a parallel direction of the first wire, the first feeding point and the second feeding point are located in two opposite directions, respectively, relative to the third feeding point. The first coupling section and the first central section have a first turning point located therebetween and form a first included angle. The second coupling section and the second central section have a second turning point located therebetween and form a second included angle. The first included angle and the second included angle are equal and between 75 degrees and 135 degrees. The first coupling section and the second coupling section face each other.

BRIEF DESCRIPTION OF THE DRAWINGS

The present disclosure can be more fully understood by reading the following detailed description of the embodiment, with reference made to the accompanying drawings as follows.

DETAILED DESCRIPTION

The present disclosure will now be described more specifically with reference to the following embodiments. It is to be noted that the following descriptions of preferred embodiments of this disclosure are presented herein for the purposes of illustration and description only; it is not intended to be exhaustive or to be limited to the precise form disclosed.

In addition, the terms first, second, third, etc. are used herein to describe various elements or components, these elements or components should not be limited by these terms. Consequently, a first element or component discussed below could be termed a second element or component.

Figure 1:
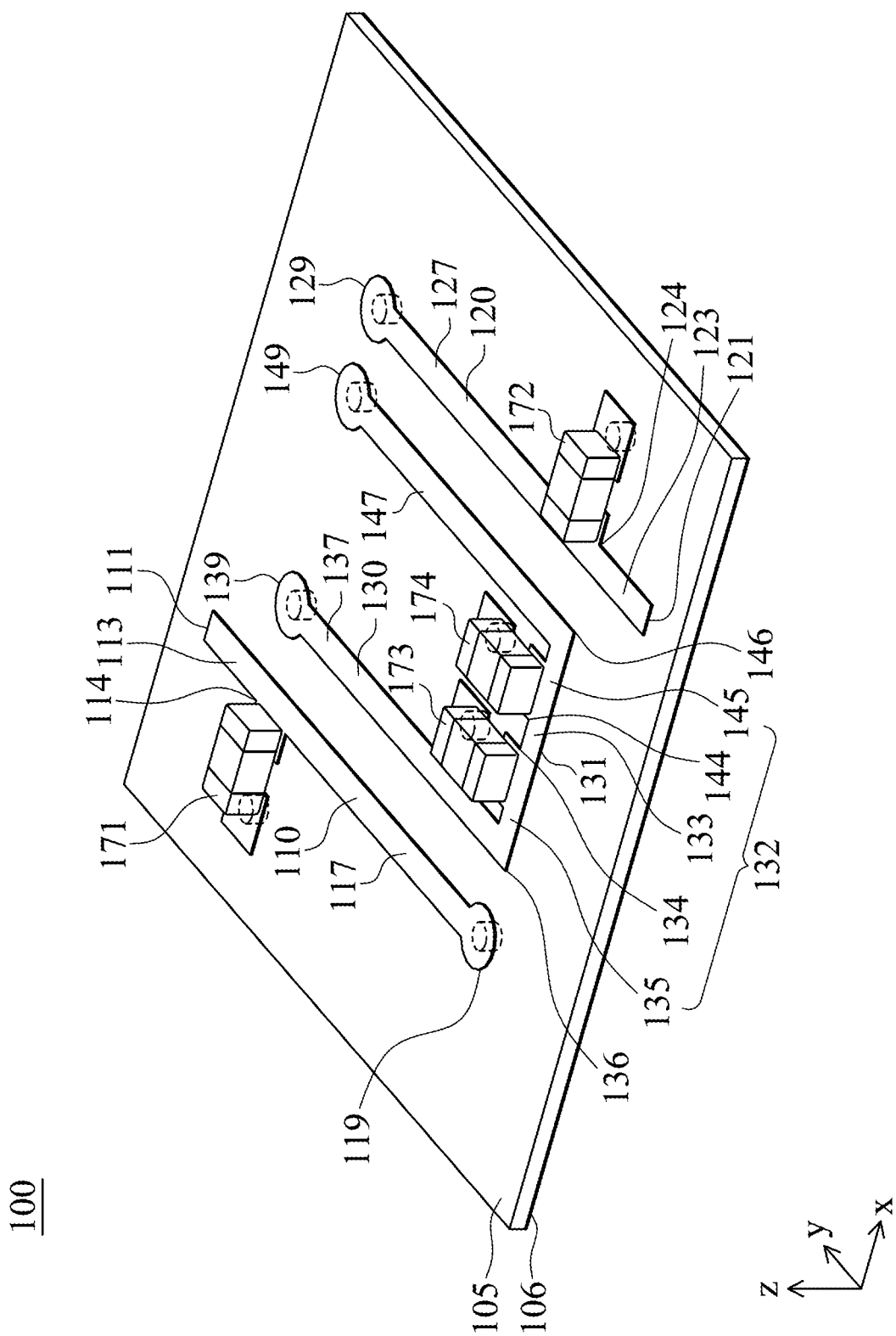
FIG. 1 is a three-dimensional view of a first state of a Balun filter according to an embodiment of the present disclosure.
Figure 2:
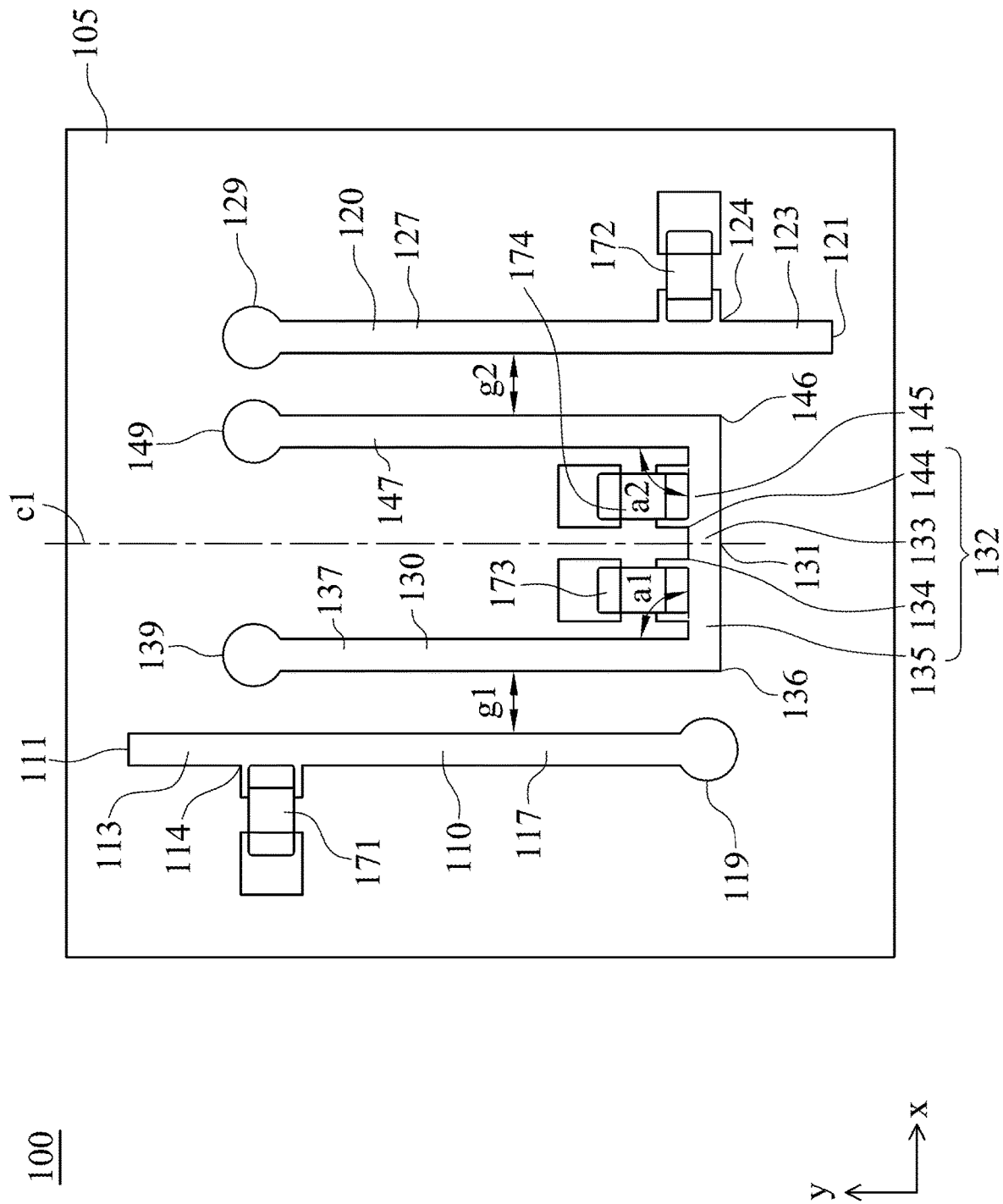
FIG. 2 is a top view of the Balun filter in FIG. 1.

FIG. 1 is a three-dimensional view of a first state of a Balun filter 100 according to an embodiment of the present disclosure, and FIG. 2 is a top view of the Balun filter 100 in FIG. 1. For clarity of disclosure, a rectangular coordinate system with a first direction x, a second direction y and a third direction z is shown in the drawings of the disclosure represent. With reference to FIG. 1 and FIG. 2, the Balun filter 100 is disposed on a circuit board 105, and includes a first wire (conductive wire) 110, a second wire 120, a third wire 130 and a ground plane 106.

The first wire 110 has one end for disposing a first feeding point 111, and the second wire 120 has one end for disposing a second feeding point 121. The third wire 130 is configured for disposing a third feeding point 131 and includes a first coupling section 137 and a second coupling section 147. The third feeding point 131 is located between the first coupling section 137 and the second coupling section 147. The first coupling section 137 is parallel and coupled to the first wire 110, and the second coupling section 147 is parallel and coupled to the second wire 120. The first wire 110, the second wire 120 and the third wire 130 are all located on a conductive layer of the circuit board 105 (e.g., as shown in FIG. 1, without labeled, the uppermost conductive layer of the circuit board 105), and the ground plane 106 is located on another conductive layer of the circuit board 105 (e.g., as shown in FIG. 1, without labeled, the lowermost conductive layer of the circuit board 105). Each of the first wire 110, the second wire 120 and the third wire 130 is coupled to the ground plane 106 and forms a transmission line with the ground plane 106. Specifically, it forms a microstrip. In a parallel direction of each of the first wire 110 and the second wire 120, the first feeding point 111 and the second feeding point 121 are located in two opposite directions, respectively, relative to the third feeding point 131. Specifically, the third feeding point 131 is an unbalanced port of the Balun filter 100, and the first feeding point 111 and the second feeding point 121 are balanced ports of the Balun filter 100. The feeding directions of the first feeding point 111 and the second feeding point 121 are opposite, and the phase difference therebetween is 180 degrees. In another embodiment according to the present disclosure, each of the first wire, the second wire and the third wire may be a microstrip line or a stripline, and the conductive layer of the wires and the conductive layer of the ground plane may or may not be two adjacent conductive layers in the stacked circuit board. Therefore, the Balun filter 100 integrated with a Balun, a filter and a matching circuit in a form of transmission lines is to replace the multiple chip capacitors and chip inductors of the RF front-end module in the conventional technique, and it is advantageous in effectively reducing the number of chip components used. Furthermore, the Balun filter 100 in which the Balun and the filter are designed as a single component is beneficial to save a lot of space in the RF front-end module, and has the balanced-to-unbalanced effect and the filtering function at the same time.

In detail, the third wire 130 may further include a first central section 135 and a second central section 145. The third feeding point 131 is located between the first central section 135 and the second central section 145, and the first coupling section 137, the first central section 135, the second central section 145 and the second coupling section 147 are electrically connected in sequence. The first coupling section 137 and the first central section 135 have a first turning point 136 located therebetween and form a first included angle a1. The second coupling section 147 and the second central section 145 have a second turning point 146 located therebetween and form a second included angle a2. The first included angle a1 and the second included angle a2 are equal and may be between 75 degrees and 135 degrees. The first coupling section 137 and the second coupling section 147 face each other. Therefore, designing the miniaturized Balun filter 100 in the form of transmission lines on the circuit board 105 is advantageous in integrating the Balun filter 100 with the components of the previous and following stages (e.g., an antenna, a RF chip, etc.) and reducing the volume. Furthermore, the first included angle a1 and the second included angle a2 may be between 85 degrees and 95 degrees. In addition, the term "connect" mentioned in the present disclosure means that there is a physical connection between two elements and it is a direct connection or an indirect connection. The term "couple" mentioned in the present disclosure means that two elements are separated from each other and have no physical connection, and the electric field energy generated by the current of one element excites the electric field energy of the other element.

Figure 3:
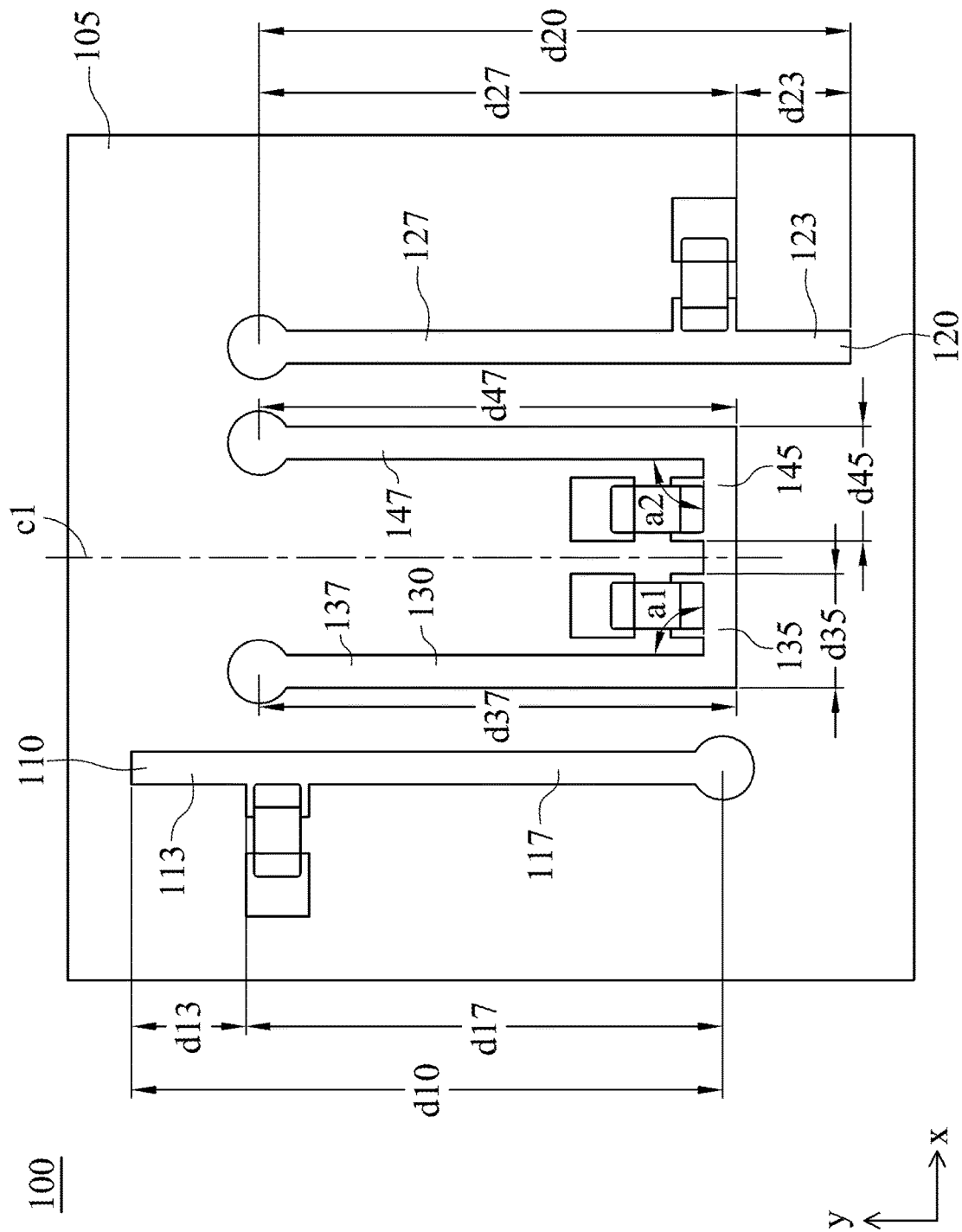
FIG. 3 is a parameter schematic view of the Balun filter in FIG. 1.

FIG. 3 is a parameter schematic view of the Balun filter 100 in FIG. 1. With reference to FIG. 2 and FIG. 3, a length d37 of the first coupling section 137 and a length d47 of the second coupling section 147 may be equal, and a length d35 of the first central section 135 and a length d45 of the second central section 145 may be equal. A central axis c1 passes through the third feeding point 131, and a shape of the third wire 130 is symmetrical to the central axis c1. Furthermore, the third wire 130 includes the first coupling section 137, the first turning point 136, the bottom portion 132, the second turning point 146 and the second coupling section 147 in sequence. The bottom portion 132 includes the first central section 135, the third node 134, the third feeding section 133, the fourth node 144 and the second central section 145 in sequence, and the third feeding section 133 is configured for disposing the third feeding point 131. The shape of the third wire 130 is U-shaped and symmetrical to the central axis c1, that is, the first coupling section 137 and the second coupling section 147 are bent in the same direction (i.e., the positive direction of the second direction y) and face each other, and the U-shaped third wire 130 is coupled to the first wire 110 and the second wire 120 on both sides thereof. Therefore, the Balun filter 100 is advantageous in simplifying the entire RF front-end module, reducing usage rate of the module area, increasing the available space, saving manufacturing costs and time, and thus improving the yield rate.

Each of the first included angle a1 and the second included angle a2 may be 90 degrees. The second wire 120 is parallel to the first wire 110. The first wire 110 is located farther from the central axis c1 than the first coupling section 137 therefrom, and the second wire 120 is located farther from the central axis c1 than the second coupling section 147 therefrom. The direction of the second wire 120 extended from the second feeding point 121 is opposite to the direction of the first wire 110 extended from first feeding point 111. A length d10 of the first wire 110 and a length d20 of the second wire 120 are equal, and a first spacing g1 between the first wire 110 and the first coupling section 137 and a second spacing g2 between the second wire 120 and the second coupling section 147 are equal. Therefore, the requirements of small size and coupling distance can be satisfied at the same time.

Figure 4:
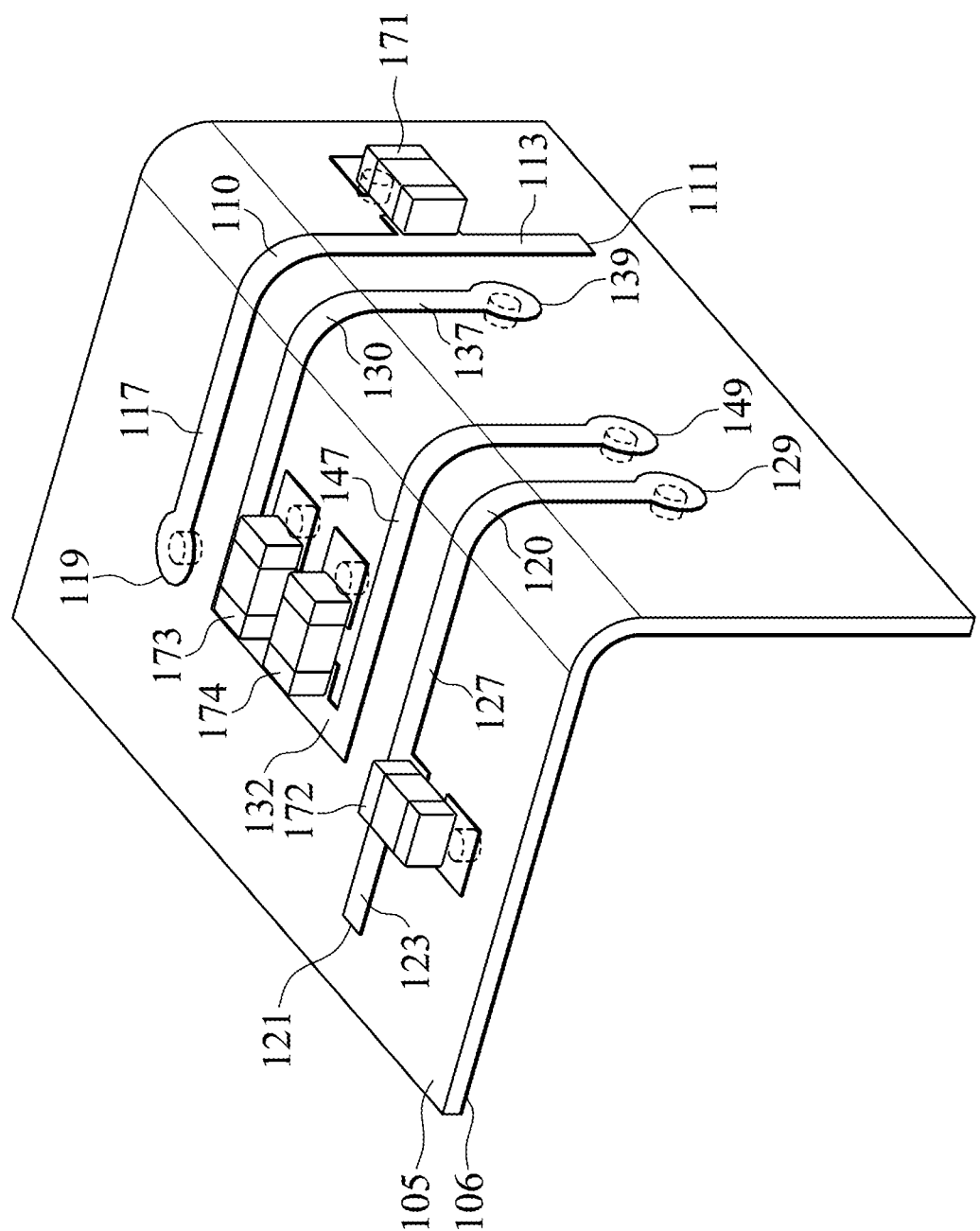
FIG. 4 is a three-dimensional view of a second state of the Balun filter in FIG. 1.

FIG. 4 is a three-dimensional view of a second state of the Balun filter 100 in FIG. 1. With reference to FIG. 1 and FIG. 4, the circuit board 105 may be a liquid crystal polymer (LCP) flexible board or in other type of flexible boards. The first state of the Balun filter 100 in FIG. 1 is a flat state, and the second state of the Balun filter 100 in FIG. 4 is a bending state. Therefore, the Balun filter 100 can be bent in a limited space and mechanism, and the characteristics after bending remain unchanged, so it has more design flexibility and advantages compared with rigid boards. In addition, it should be understood that the shape and area of the circuit board provided with the Balun filter according to the present disclosure are not limited to those shown in FIG. 1 to FIG. 4, and the bending state of the Balun filter is not limited to that shown in FIG. 1.

With reference to FIG. 2 and FIG. 3, a ratio of the length d37 of the first coupling section 137 to an effective wavelength of the circuit board 105 corresponding to an operating frequency of the Balun filter 100 may be between 0.25% and 5%. Furthermore, the ratio may be between 0.5% and 2%. The first spacing g1 may be between 0.2 mm and 0.8 mm. The width of the first wire 110, the width of the second wire 120 and the width of the third wire 130 may be equal. The ratio of the first spacing g1 to the width of the first wire 110 may be between 1 and 4. Moreover, the first spacing g1 may be between 0.3 mm and 0.5 mm, and the ratio of the first spacing g1 to the width of the first wire 110 may be between 1.5 and 2.5. Therefore, the Balun filter 100 can achieve miniaturization while also meeting filtering characteristic requirements. In the embodiment of the Balun filter 100, the length d37 of the first coupling section 137 is 2.63 mm. As an example, the operating frequency of the Balun filter 100 is approximately 0.9 GHZ, the corresponding effective wavelength of the circuit board 105 is 216 mm, and the ratio of the length d37 of the first coupling section 137 to the effective wavelength of the circuit board 105 corresponding to the operating frequency of the Balun filter 100 is about 1/82 (i.e., 1.2%). The first spacing g1 is 0.35 mm, the width of the first wire is 0.18 mm, and the ratio of the first spacing g1 to the width of the first wire 110 is 1.94.

The first coupling section 137 may be extended from the first turning point 136 to a third ground end 139, the second coupling section 147 may be extended from the second turning point 146 to a fourth ground end 149, and each of the third ground end 139 and the fourth ground end 149 is electrically connected to the ground plane 106 via a through hole (through holes in the present disclosure are not labeled in the drawings). Therefore, it is advantageous in signal coupling between the balanced port and unbalanced ports. In another embodiment according to the present disclosure, the grounding manners of the wires and capacitors can be direct electrical connecting to a ground wire or ground block on the same conductive layer, and then electrical connecting to a ground plane of another conductive layer via a through hole.

The first wire 110 may be extended from the first feeding point 111 to a first ground end 119, the second wire 120 may be extended from the second feeding point 121 to a second ground end 129, and each of the first ground end 119 and the second ground end 129 is electrically connected to the ground plane 106 via a through hole. The first ground end 119 is located adjacent to the first turning point 136, and the second ground end 129 is located adjacent to the fourth ground end 149. Therefore, the balanced-to-unbalanced characteristic of the Balun filter 100 can be achieved.

The Balun filter 100 may further include a first capacitor 171 and a second capacitor 172. One end of the first capacitor 171 is electrically connected to a first node 114 of the first wire 110, and the other end of the first capacitor 171 is electrically connected to the ground plane 106 via a through hole. One end of the second capacitor 172 is electrically connected to a second node 124 of the second wire 120, and the other end of the second capacitor 172 is electrically connected to the ground plane 106 via a through hole. The first capacitor 171 and the second capacitor 172 are chip capacitors and have the same capacitance values. Therefore, it is beneficial to reduce the required resonance size (resonance length) on the Balun filter 100.

The Balun filter 100 may further include a third capacitor 173 and a fourth capacitor 174. One end of the third capacitor 173 is electrically connected to the first central section 135 and the third node 134, and the other end of the third capacitor 173 is electrically connected to the ground plane 106 via a through hole. One end of the fourth capacitor 174 is electrically connected to the second central section 145 and the fourth node 144, and the other end of the fourth capacitor 174 is electrically connected to the ground plane 106 via a through hole. The third capacitor 173 and the fourth capacitor 174 are symmetrical to the central axis c1, and the third capacitor 173 and the fourth capacitor 174 are chip capacitors and have the same capacitance values. Therefore, it is further beneficial to reduce the required resonance size on the Balun filter 100, e.g., further reducing the resonance size of 1/4 wavelength in the conventional technique to the resonance size of 1/82 wavelength of the present disclosure. In the embodiment of the Balun filter 100, each of the first capacitor 171, the second capacitor 172, the third capacitor 173 and the fourth capacitor 174 may be a chip capacitor with a capacitance value of 12 pF and a size of 01005, and the dimensions of the Balun filter 100 in the first direction x, the second direction y and the third direction z may be approximately 3 mm, 3.5 mm and 2.08 mm, respectively.

The first wire 110 may include a first feeding section 113 and a first ground section 117. The first feeding section 113 is extended from the first feeding point 111 to the first node 114, and the first ground section 117 is extended from the first node 114 to the first ground end 119. The second wire 120 may include a second feeding section 123 and a second ground section 127. The second feeding section 123 is extended from the second feeding point 121 to the second node 124, and the second ground section 127 is extended from the second node 124 to the second ground end 129. The length d17 of the first ground section 117, the length d37 of the first coupling section 137, the length d27 of the second ground section 127 and the length d47 of the second coupling section 147 are equal, and each of the lengths d17, d27, d37, d47 is specifically calculated from the center of the through hole on the corresponding ground end (as shown in FIG. 3). Therefore, the Balun filter 100 does not only have balanced-to-unbalanced characteristics, but also have a filtering function.

The length d13 of the first feeding section 113, the length d35 of the first central section 135, the length d23 of the second feeding section 123 and the length d45 of the second central section 145 are equal. Therefore, it is beneficial to improve the amplitude balance between the first feeding point 111 and the second feeding point 121, e.g., the amplitude balance is less than 0.5 dB. Furthermore, a ratio of the length d17 of the first ground section 117 to the length d13 of the first feeding section 113 may be between 3 and 5. Therefore, the balanced-to-unbalanced characteristics, filtering characteristics and miniaturization can be achieved. In the embodiment of the Balun filter 100, the length d17 of the first ground section 117 is 2.63 mm, the length d13 of the first feeding section 113 is 0.63 mm, and thus the ratio of the length d17 of the first ground section 117 to the length d13 of the first feeding section 113 is 4.17.

Figure 5:
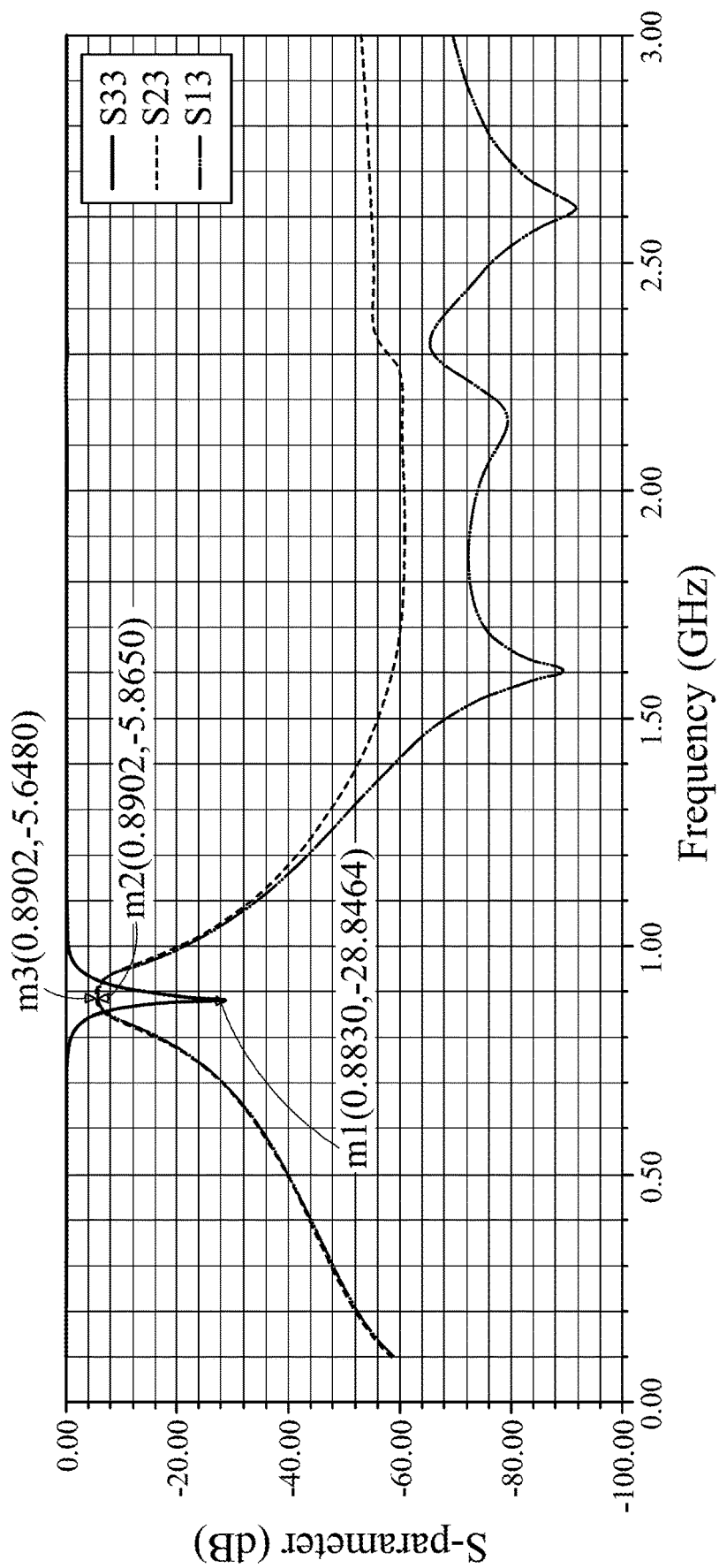
FIG. 5 is an S-parameter schematic view of the Balun filter in FIG. 1.

FIG. 5 is an S-parameter schematic view of the Balun filter 100 in FIG. 1. With reference to FIG. 5, the passband of the Balun filter 100 is about 0.860 GHz to 0.910 GHz. The marking point m1 on the S33 parameter curve is about −28.8 dB. The marking point m2 on the S23 parameter curve is about −5.8 dB. The marking point m3 on the S13 parameter curve is about −5.6 dB.

Figure 6:
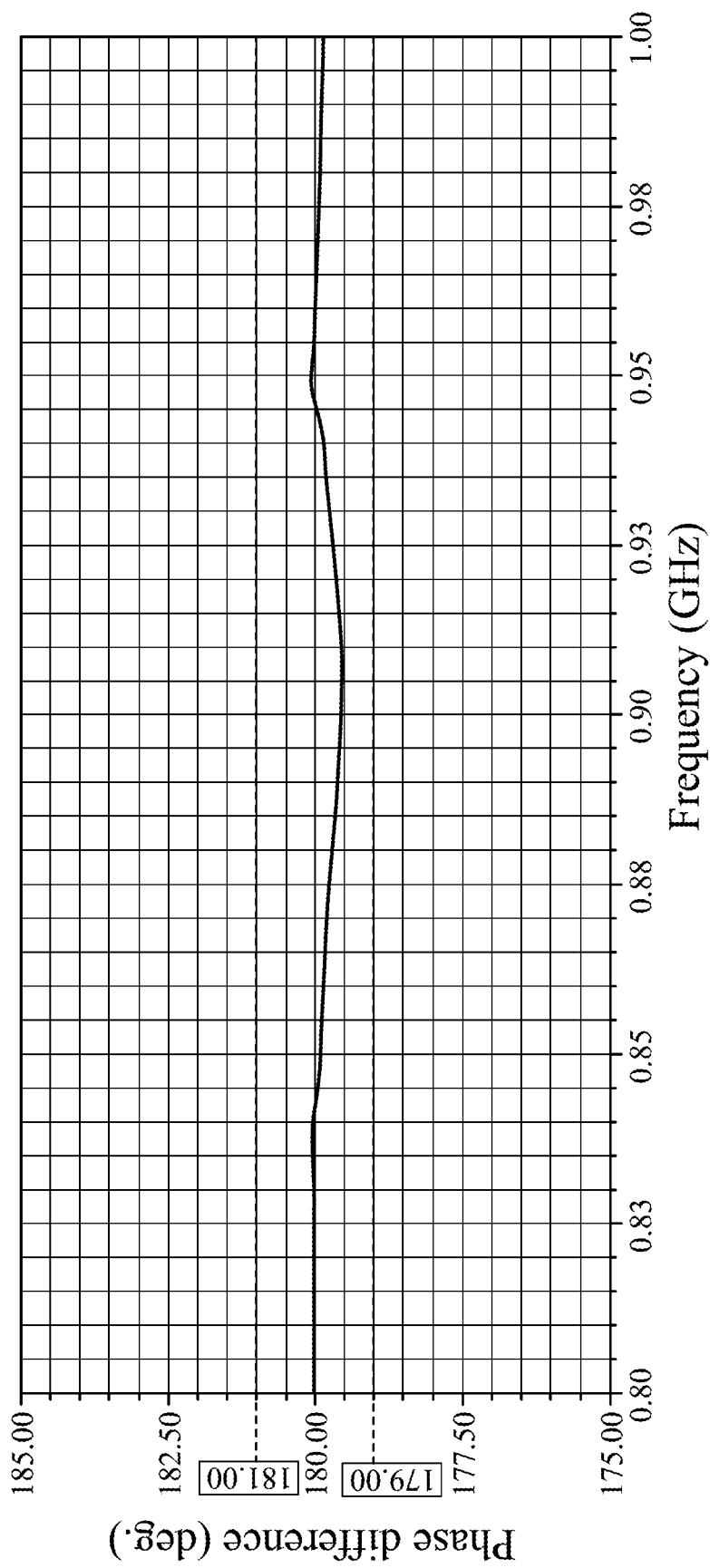
FIG. 6 is a schematic view of the phase difference of the Balun filter in FIG. 1.

FIG. 6 is a schematic view of the phase difference of the Balun filter 100 in FIG. 1. With reference to FIG. 6, the phase difference between the first feeding point 111 and the second feeding point 121 of the Balun filter 100 in the frequency band of 0.8 GHz to 1 GHz is 180 degrees±1 degree.

Figure 7:
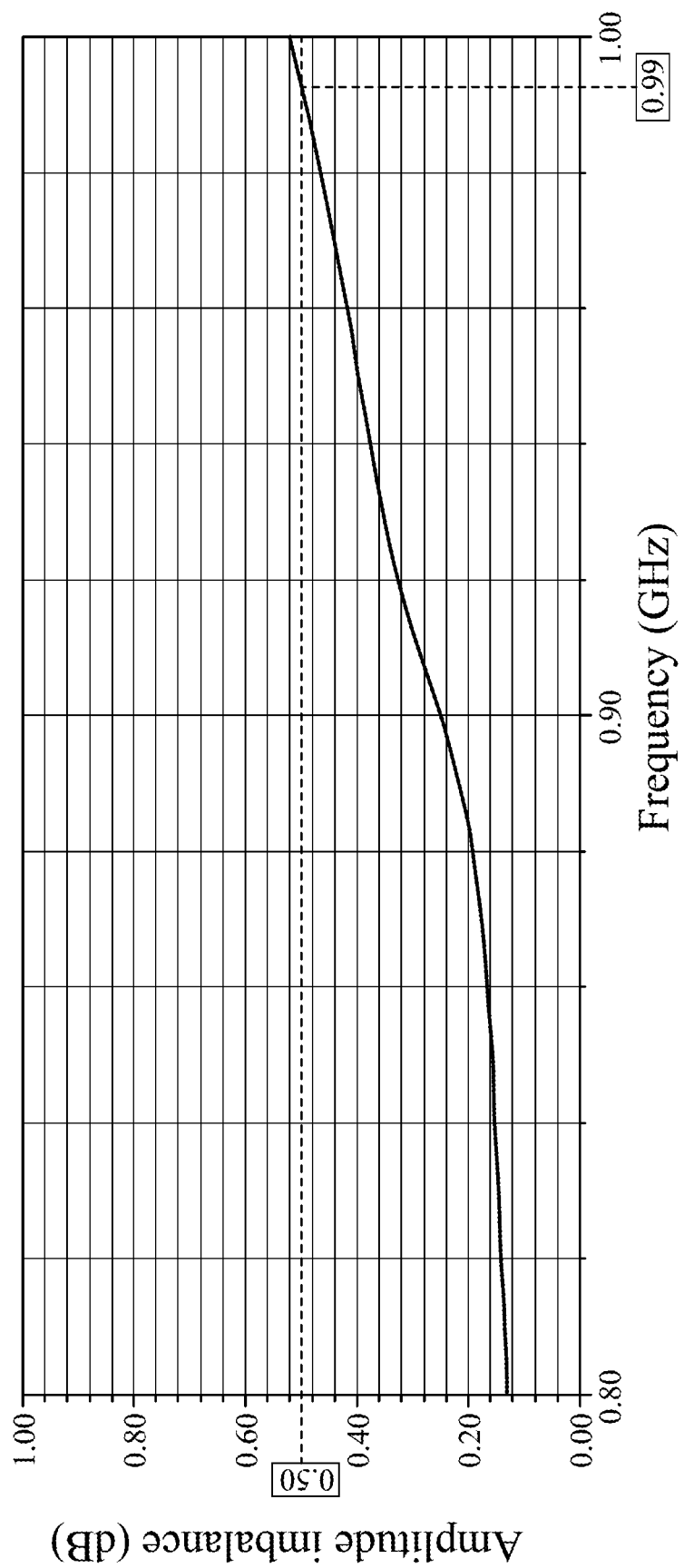
FIG. 7 is a schematic view of the amplitude imbalance of the Balun filter in FIG. 1.

FIG. 7 is a schematic view of the amplitude imbalance of the Balun filter 100 in FIG. 1. With reference to FIG. 7, The amplitude imbalance (or amplitude balance) of the first feeding point 111 and the second feeding point 121 of the Balun filter 100 in the frequency band of 0.8 GHz to 0.99 GHz is less than 0.5 dB. Accordingly, it can be seen from FIG. 5 to FIG. 7 that the Balun filter 100 not only has the filtering function, but also has the balanced-to-unbalanced characteristics.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A Balun filter, disposed on a circuit board, and comprising:
   a first wire having one end for disposing a first feeding point;
   a second wire having one end for disposing a second feeding point;
   a third wire configured for disposing a third feeding point and comprising a first coupling section, a second coupling section, a first central section and a second central section, wherein the first coupling section is parallel and coupled to the first wire, the second coupling section is parallel and coupled to the second wire, the third feeding point is located between the first central section and the second central section, and the first coupling section, the first central section, the second central section and the second coupling section are electrically connected in sequence; and
   a ground plane;
   wherein the first wire, the second wire and the third wire are all located on a conductive layer of the circuit board, the ground plane is located on another conductive layer of the circuit board, and each of the first wire, the second wire and the third wire is coupled to the ground plane and forms a transmission line with the ground plane;
   wherein in a parallel direction of the first wire, the first feeding point and the second feeding point are located in two opposite directions, respectively, relative to the third feeding point;
   wherein the first coupling section and the first central section have a first turning point located therebetween and form a first included angle, the second coupling section and the second central section have a second turning point located therebetween and form a second included angle, the first included angle and the second included angle are equal and between 75 degrees and 135 degrees, and the first coupling section and the second coupling section face each other.

2. The Balun filter of claim 1, wherein a length of the first coupling section and a length of the second coupling section are equal, a length of the first central section and a length of the second central section are equal, a central axis passes through the third feeding point, and a shape of the third wire is symmetrical to the central axis.

3. The Balun filter of claim 2, wherein the first included angle is 90 degrees, the first wire is located farther from the central axis than the first coupling section therefrom, and the second wire is located farther from the central axis than the second coupling section therefrom;
   wherein a length of the first wire and a length of the second wire are equal, and a first spacing between the first wire and the first coupling section and a second spacing between the second wire and the second coupling section are equal.

4. The Balun filter of claim 3, wherein the first coupling section is extended from the first turning point to a third ground end, the second coupling section is extended from the second turning point to a fourth ground end, and each of the third ground end and the fourth ground end is electrically connected to the ground plane via a through hole.

5. The Balun filter of claim 4, wherein the first wire is extended from the first feeding point to a first ground end, the second wire is extended from the second feeding point to a second ground end, and each of the first ground end and the second ground end is electrically connected to the ground plane via a through hole;
   wherein the first ground end is located adjacent to the first turning point, and the second ground end is located adjacent to the fourth ground end.

6. The Balun filter of claim 5, further comprising:
   a first capacitor, wherein one end of the first capacitor is electrically connected to a first node of the first wire, and the other end of the first capacitor is electrically connected to the ground plane via a through hole; and
   a second capacitor, wherein one end of the second capacitor is electrically connected to a second node of the second wire, and the other end of the second capacitor is electrically connected to the ground plane via a through hole;
   wherein the first capacitor and the second capacitor are chip capacitors and have the same capacitance values.

7. The Balun filter of claim 6, wherein the first wire includes a first feeding section and a first ground section, the first feeding section is extended from the first feeding point to the first node, and the first ground section is extended from the first node to the first ground end;
   wherein the second wire includes a second feeding section and a second ground section, the second feeding section is extended from the second feeding point to the second node, and the second ground section is extended from the second node to the second ground end;
   wherein a length of the first ground section, the length of the first coupling section, a length of the second ground section and the length of the second coupling section are equal.

8. The Balun filter of claim 7, wherein a length of the first feeding section, the length of the first central section, a length of the second feeding section and the length of the second central section are equal, and a ratio of the length of the first ground section to the length of the first feeding section is between 3 and 5.

9. The Balun filter of claim 4, further comprising:
   a third capacitor, wherein one end of the third capacitor is electrically connected to the first central section, and the other end of the third capacitor is electrically connected to the ground plane via a through hole; and
   a fourth capacitor, wherein one end of the fourth capacitor is electrically connected to the second central section, and the other end of the fourth capacitor is electrically connected to the ground plane via a through hole;
   wherein the third capacitor and the fourth capacitor are symmetrical to the central axis, and the third capacitor and the fourth capacitor are chip capacitors and have the same capacitance values.

10. The Balun filter of claim 3, wherein the circuit board is a liquid crystal polymer flexible board, a ratio of the length of the first coupling section to an effective wavelength of the circuit board corresponding to an operating frequency of the Balun filter is between 0.25% and 5%, and the first spacing is between 0.2 mm and 0.8 mm.

* * * * *